US011699607B2

(12) United States Patent
Gerling et al.

(10) Patent No.: US 11,699,607 B2
(45) Date of Patent: Jul. 11, 2023

(54) SEGMENTED MULTI-CHANNEL, BACKSIDE ILLUMINATED, SOLID STATE DETECTOR WITH A THROUGH-HOLE FOR DETECTING SECONDARY AND BACKSCATTERED ELECTRONS

(71) Applicant: KLA Corporation, Milpitas, CA (US)

(72) Inventors: John Gerling, Livermore, CA (US);
Lawrence Muray, Moraga, CA (US);
Alan Brodie, Palo Alto, CA (US);
James Spallas, San Ramon, CA (US);
Marcel Trimpl, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/483,545

(22) Filed: Sep. 23, 2021

(65) Prior Publication Data
US 2022/0399220 A1    Dec. 15, 2022

Related U.S. Application Data

(60) Provisional application No. 63/208,508, filed on Jun. 9, 2021.

(51) Int. Cl.
*H01L 21/67*    (2006.01)
*H01J 37/26*    (2006.01)
(Continued)

(52) U.S. Cl.
CPC ..... *H01L 21/67288* (2013.01); *G01N 23/203* (2013.01); *G01N 23/2251* (2013.01);
(Continued)

(58) Field of Classification Search
CPC ............ H01L 21/67288; G01N 23/203; G01N 23/2251; G01N 2223/6116; G01N 2223/646; H01J 37/244; H01J 37/26
See application file for complete search history.

(56) References Cited

U.S. PATENT DOCUMENTS 7,514,681 B1 *   4/2009   Marella ................. H01J 37/292
                                                      324/501
9,767,986 B2 *   9/2017   Brown ................ H01L 27/1464
(Continued)

FOREIGN PATENT DOCUMENTS

| JP | 2019197733 A | 11/2019 |
| WO | 02084697 A1 | 10/2002 |
| WO | 2013022735 A1 | 2/2013 |

OTHER PUBLICATIONS

International Search Report and Written Opinion, PCT/US/2022/032033, International filing date Jun. 3, 2022, dated Sep. 27, 2022, 6 pages.
(Continued)

*Primary Examiner* — David A Vanore
(74) *Attorney, Agent, or Firm* — Kwan & Olynick LLP (57) ABSTRACT

A segmented detector device with backside illumination. The detector is able to collect and differentiate between secondary electrons and backscatter electrons. The detector includes a through-hole for passage of a primary electron beam. After hitting a sample, the reflected secondary and backscatter electrons are collected via a vertical structure having a P+/P−/N+ or an N+/N−/P+ composition for full depletion through the thickness of the device. The active area of the device is segmented using field isolation insulators located on the front side of the device.

20 Claims, 11 Drawing Sheets

(51) Int. Cl.
*H01J 37/244* (2006.01)
*G01N 23/203* (2006.01)
*G01N 23/2251* (2018.01)

(52) U.S. Cl.
CPC ............ *H01J 37/244* (2013.01); *H01J 37/26* (2013.01); *G01N 2223/6116* (2013.01); *G01N 2223/646* (2013.01)

(56) References Cited

U.S. PATENT DOCUMENTS

| | | | | |
|---|---|---|---|---|
| 10,466,212 | B2* | 11/2019 | Brown | H01L 27/14661 |
| 11,222,766 | B2* | 1/2022 | Wang | H01J 37/244 |
| 2011/0036981 | A1* | 2/2011 | Zhao | H01J 37/226 250/306 |
| 2011/0169116 | A1 | 7/2011 | Nanver et al. | |
| 2016/0064184 | A1* | 3/2016 | Brown | H01L 27/14661 250/307 |
| 2016/0148780 | A1* | 5/2016 | Agrawal | H01J 37/285 250/307 |
| 2017/0329025 | A1* | 11/2017 | Brown | H01L 27/1464 |
| 2020/0212246 | A1 | 7/2020 | Lorito et al. | |
| 2020/0286708 | A1* | 9/2020 | Wang | H01J 37/244 |

OTHER PUBLICATIONS

A. Sakic, L. K. Nanver, et al., "Versatile silicon photodiode detector technology for scanning electron microscopy with high-efficiency sub-5 keV electron detection", 2010 International Electron Devices Meeting, Jun. 8, 2010; DOI: 10.1109/IEDM.2010.5703458, 4 pgs.

Agata Sakic, et al., "Ultrashallow junction silicon photodiodes for detection of low energy electrons", Proceedings 13th SAFE Workshop of the STW.ICT Conference 2010. ed./P French et al. Utrecht, The Netherlands: STW, 2010. p. 150-153.

Michael D.G. Steigerwald, "Ultra Low Voltage BSE Imaging", Microscopy Today Nov./Dec. 2003, pp. 26-28.

Winson Kuo, et al., "Characterisation of Catalysts Using Secondary and Backscattered Electron In-lens Detectors", Apr. 2014 Platinum Metals Review 58(2): 106-110, DOI:10.1595/147106714X680113, 5 pgs.

* cited by examiner

SEGMENTED MULTI-CHANNEL, BACKSIDE ILLUMINATED, SOLID STATE DETECTOR WITH A THROUGH-HOLE FOR DETECTING SECONDARY AND BACKSCATTERED ELECTRONS

CROSS-REFERENCE TO RELATED APPLICATIONS

This application claims the benefit of prior application U.S. Provisional Application No. 63/208,508, filed Jun. 9, 2021, by John Gerling et al., which is herein incorporated by reference in its entirety for all purposes.

TECHNICAL FIELD

The disclosure generally relates to the field of wafer inspection systems. More particularly the present disclosure relates to miniature electron beam column detectors.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

Thus, being able to detect smaller and smaller defects has become increasingly important. Types of defects, counts of defects, and signatures found by inspection systems (or inspectors) provide valuable information for semiconductor fabrication to ensure that the manufacturing process established in the research and development phase can ramp, that the process window confirmed in the ramp phase can be transferrable to high volume manufacturing (HVM), and that day-to-day operations in HVM are stable and under-control.

One method for detecting defects is by using a scanning electron microscope (SEM). A SEM can include a plurality of electron beam columns with built-in detectors. As semi-conductor devices shrink in size, the detectable defect size decreases and is extremely challenging to detect with traditional optical methods due to the limiting factor of the wavelength of light. One method for detecting these defects is to use electron beams where the wavelength of electron beams can be much smaller than the wavelength of light. However, it is slow in terms of throughput—single column electron beam inspection of a wafer can take days or weeks. To solve this problem, miniaturized multi-column or multi-beam SEMs can enable massively parallel inspection of wafers. Currently, the state of the art can achieve miniature electron beam columns one inch tall. However, since the column itself is so small, there is not much space for standard detectors. Normally, separate detectors are used to detect secondary electrons (SE) and backscatter electrons (BSE). However, given the limited amount of space in miniature electron beam columns, a new and improved detector is needed.

SUMMARY

The following presents a simplified summary of the disclosure in order to provide a basic understanding of certain embodiments of the disclosure. This summary is not an extensive overview of the disclosure and it does not identify key/critical elements of the disclosure or delineate the scope of the disclosure. Its sole purpose is to present some concepts disclosed herein in a simplified form as a prelude to the more detailed description that is presented later.

One aspect of the present disclosure is directed to a solid state device. The solid state device includes a vertical structure. The vertical structure includes an N+/P−/P+ or a P+/N−/N+ structure for full depletion through the thickness of the device. The N+/P−/P+ or a P+/N−/N+ structure includes an N+ or P+ junction formed on the front side of the device, a P− or N− intrinsic layer in the middle, and a P+ or N+ layer formed on the backside of the device. The device also includes an active area for collecting secondary electrons (SEs) and backscatter electrons (BSEs). The active area is segmented into multiple channels in order to separate detection of secondary and backscatter electrons. A through hole is placed in the center of the device to allow a primary beam to pass through the device. The primary beam enters the through hole on the front side of the device.

Another aspect of the present disclosure is directed to system. The system includes an electron source, a ceramic substrate, and a device coupled to the ceramic substrate. The device includes a vertical structure. The vertical structure includes an N+/P−/P+ or a P+/N−/N+ structure for full depletion through the thickness of the device. The N+/P−/P+ or a P+/N−/N+ structure includes an N+ or P+ junction formed on the front side of the device, a P− or N− intrinsic layer in the middle, and a P+ or N+ layer formed on the backside of the device. The device also includes an active area for collecting secondary electrons (SEs) and backscatter electrons (BSEs). The active area is segmented into multiple channels in order to separate detection of secondary and backscatter electrons. A through hole is placed in the center of the device to allow a primary beam to pass through the device. The primary beam enters the through hole on the front side of the device.

Yet another aspect of the present disclosure is directed to method for determining defects on a wafer. The method includes shooting a primary electron beam at the wafer. Then, the method continues with collecting secondary and backscatter electrons on a solid state device. The device includes a vertical structure. The vertical structure includes an N+/P−/P+ or a P+/N−/N+ structure for full depletion through the thickness of the device. The N+/P−/P+ or a P+/N−/N+ structure includes an N+ or P+ junction formed on the front side of the device, a P− or N− intrinsic layer in the middle, and a P+ or N+ layer formed on the backside of the device. The device also includes an active area for collecting secondary electrons (SEs) and backscatter electrons (BSEs). The active area is segmented into multiple channels in order to separate detection of secondary and backscatter electrons. A through hole is placed in the center of the device to allow a primary beam to pass through the device. The primary beam enters the through hole on the front side of the device.

In some embodiments, the segmentation appears on the front side of the device and SEs and BSEs are collected on the back side of the device. In some embodiments, the front side of the device also includes metal contacts to maximize the available area for SE and BSE collection. In some embodiments, the P+ layer comprises boron or another acceptor dopant. In some embodiments, the P+ layer includes an additional conductive coating. The device further includes a post lens element for controlling the SE and BSE signals on the device. In some embodiments, the segmented channels comprise a circular center channel surrounded by four quadrants of equal area, wherein each of the four quadrants has the same area as the circular center channel.

These and other aspects of the disclosure are described further below with reference to the figures.

DETAILED DESCRIPTION OF EXAMPLE EMBODIMENTS

In the following description, numerous specific details are set forth in order to provide a thorough understanding of the present disclosure. The present disclosure may be practiced without some or all of these specific details. In other instances, well known process operations have not been described in detail to not unnecessarily obscure the present disclosure. While the disclosure will be described in conjunction with the specific embodiments, it will be understood that it is not intended to limit the disclosure to the embodiments.

Defects in wafers can be detected using high resolution, distributed probe inspection tools in the form of SEMs having multiple distributed miniature columns, multiple atomic force microscope (AFM) probes, a near-field microwave tool with multiple probes, ion beam probes, or multiple proximal optical probes. Suitable miniaturized e-beam column technologies are further described in U.S. Pat. No. 8,698,094 B1 and U.S. Pat. No. 8,455,838 B2, which patents are incorporated herein by reference for all purposes. Viable high-resolution near-field microwave probe technology is described in U.S. Patent Application with Publication No. 2013/0088245, which application is incorporated herein by reference for all purposes. Example high-resolution AFM probe configurations is described further in U.S. Pat. No. 8,997,258 B2, which patent is incorporated herein by reference for all purposes. With miniature electron beam columns, traditional electron beam detectors do not have enough space to operate. Thus, miniature electron beam columns will have to use modified detectors.

In some traditional electron beam detectors, the anode and cathode contacts are put on the active area side or the illuminated side of the device, i.e., the charge transport is lateral. However, this leads to several disadvantages. For example, if anode and cathode contacts are located on the active area or illuminated side of the device, then charge-carriers flow laterally, thereby reducing the collection efficiency due to the contacts and isolation regions occupying the device active area.

In addition, traditional segmented detectors had the segmentation on the active area side or the illuminated side. However, this reduced the collection efficiency of the detector due to addition of insulator isolation between segments.

Traditional electron beam detector devices also use a specially designed metal shield to cover up the exposed insulator on the active area, or simply left the insulator exposed. However, the exposed insulators on the active area side or illuminated side could charge up and potentially cause damage to the device and/or affect the electron beam as it passes through the device. Thus, traditional detector devices often required the addition of shields to mitigate charging concerns. For more information on shields, please U.S. Pat. No. 9,418,819, which is incorporated by reference for all purposes.

Additionally, traditional detector devices usually split the secondary electron (SE) and backscatter electron (BSE) detection functions into physically different and separate detectors, e.g., one detector for SE detection and another detector for BSE detection. This may prove problematic as electron beam columns shrink in size because space is limited and additional electron filtering optics may be difficult to implement.

Given the problems of traditional detector devices, some of which were presented above, there exists a need for an improved detector device that allows for simultaneous collection and differentiation of SE and BSE signals in a small form factor. The techniques and mechanisms described in the present disclosure provide for simultaneous collection and differentiation of SE and BSE signals in a single detector. In addition, the techniques and mechanisms described herein provide example packaging approaches, as well as example system implementations, the details of where are described below with reference to the following figures.

Figure 1:
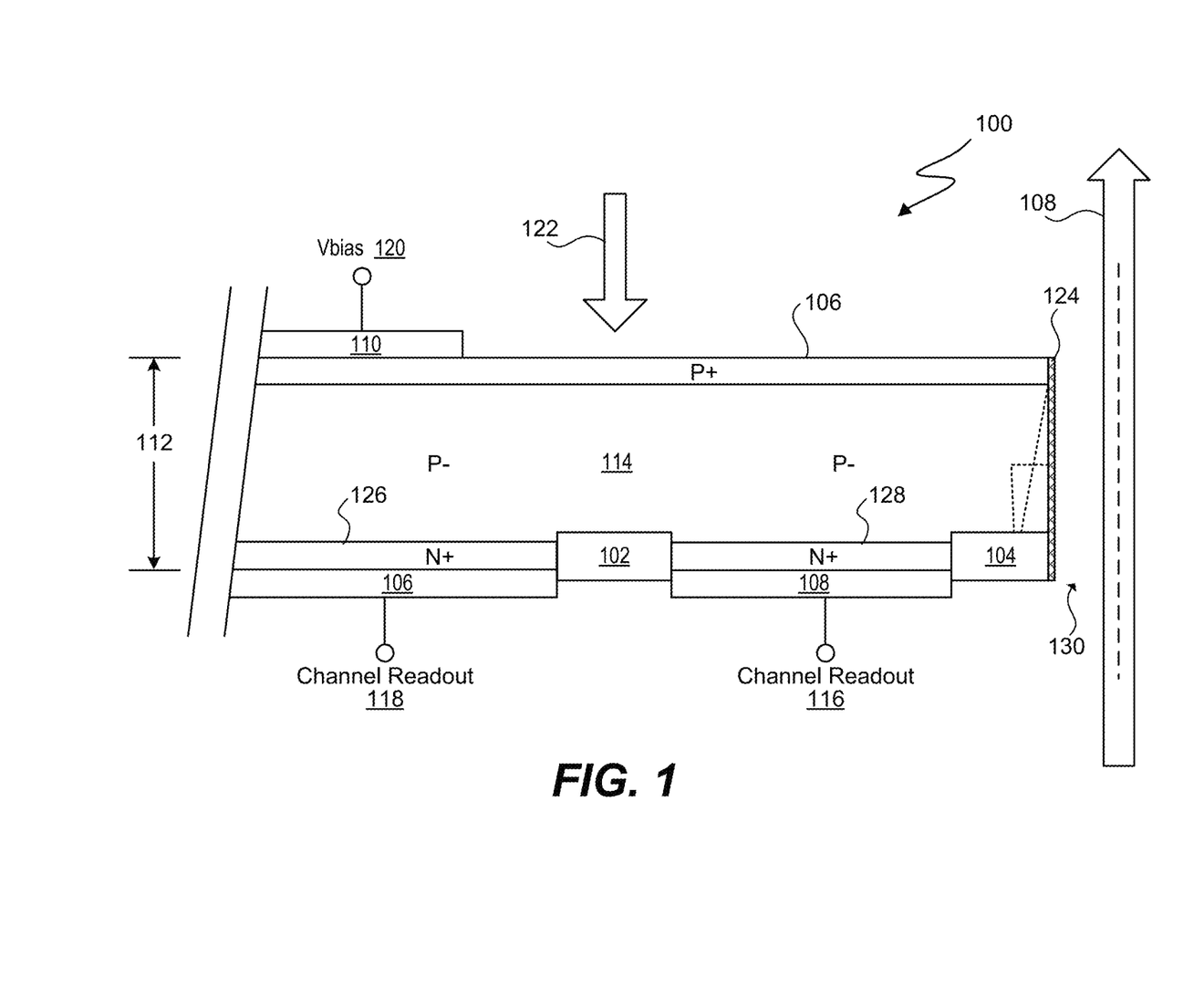
FIG. 1 is a diagram depicting a cross-section of a detector device, in accordance with embodiments of the present disclosure.

FIG. 1 is a diagram depicting a cross-section of a detector device, in accordance with embodiments of the present disclosure. In some embodiments, device 100 is a segmented multi-channel, backside illuminated, solid state device with a through-hole 130 for detecting secondary and backscattered electron signals 122 simultaneously.

In some embodiments, device 100 includes a vertical structure 112 comprising a N+/P−/P+ structure for full depletion through the thickness of device. In some embodiments, device 100 is designed for backside illumination, meaning a primary electron beam 108 is emitted from an electron source and passes through through-hole 130 and hits a sample, e.g., a wafer. After primary beam 108 hits the sample, SE and BSE 122 are reflected back toward device 100 and hit device 100 on the backside, hitting P+ layer 106 first.

In other embodiments, device 100 includes a vertical structure 112 comprising of a P+/N−/N+ structure for frontside illumination with different electrical performance. The primary difference being that the collection efficiency may be reduced due to the cathode area having patterned insulator features isolating the segments. N channel devices generally have higher carrier mobility due to electrons being the majority carrier, while P channel devices have lower carrier mobility due to holes being the majority carrier. There are tradeoffs between N channel and P channel devices, e.g., response time due to carrier mobility, bias voltage, depletion width, radiation hardness, but either type works for device 100.

In some embodiments, P+ layer 106 is also in contact with metal contact 110 on the backside of device 100, i.e., the illuminated side. In some embodiments, P+ layer 106 may include boron or another acceptor dopant and may have graded doping levels, with the surface being much more heavily doped than towards the bottom. In some embodiments, P+ layer 106 may be formed by deposition, for example, atomic layer deposition, with successive thermal anneal to form a shallow implant without leaving a native oxide on the sensitive surface.

In some embodiments, P+ layer 106 also includes a conductive coating, e.g., a thin oxide 1-4 nm (such as aluminum oxide) or other thin film, in order to protect layer 106 but still let electrons through. In some embodiments, this conductive coating is an optimization for miniature electron beam columns, because the electrons in a miniature electron beam column have low energy, which means the SE and BSE also have low energy. In order for a detector to pick up SE and BSE signals, the electrons must penetrate through P+ layer 106 into the depletion region, i.e., intrinsic P− layer 114, where the electron-hole pair can be collected and read as a signal. When an electron of sufficient energy strikes the diode it creates an electron hole pair. If the absorption occurs in the depletion region, these electron holes are swept from the junction by the built-in electric field of the depletion region. Holes move towards the anode and electrons toward the cathode and a current signal is produced. Some low energy SE and BSE may not penetrate P+ layer 106, thereby becoming trapped. Trapped charges from ionizing radiation can be holes or electrons. These can be removed by providing a conductive path for transport to metal contact 110 e.g. a conductive path or coating. However, if the surface of P+ layer 106 is an insulator, the trapped electron will start charging up the insulator, which can damage the device or affect proper electron collection. In some embodiments, the conductive coating can be a thin layer, e.g., 2 nm, of boron, which may passivate the device and may also provide a conductive surface.

In some embodiments, in the case of oxide passivation, a metal contact scheme to P+ layer 106 may be formed as a thin gridded layer or, in the case of a conductive surface, is already present as metal contact 110 on the periphery of the device.

In some embodiments, the device active area of device 100 may be segmented into different channels to differentiate between SE and BSE signals. In some embodiments, each of the channels are configured to have equal area for equal capacitance. In such embodiments, ensuring equal capacitance allows all channels to have equal or very similar responses as the other channels in order to optimize the electronic readout via channel readouts 116 and 118. In some embodiments, this is because the signal readouts are performed via amplifier circuitry positioned directly adjacent to the detector device to minimize noise.

In some embodiments, an energy filter (e.g., a gridded electrode) may be placed in front of the detector device. In such embodiments, the energy filter can also assist in separation of SE from BSE signals.

According to various embodiments, next to P+ layer 106 is a lightly doped P− intrinsic layer 114, which forms the bulk of the device for full depletion. As mentioned above, device 100 is configured such that once an incoming energetic electron penetrates through P+ layer 106, it ionizes one more lattice atoms in P− intrinsic layer 114, thereby generating multiple electron-hole pairs which leads to a device gain. The electron-hole pairs are then collected, thereby causing a signal to be detected. In some embodiments, the thickness of P− intrinsic layer 114 is thinned to optimize the carrier transit time or device response (signal rise time and bandwidth), while maintaining flatness and handling requirements.

In some embodiments, device 100 can support and be operated in a fully depleted mode, where the depletion layer, or P− intrinsic layer 114, extends to the back surface of the device. In some embodiments, the bias voltage 120 required to achieve this condition should not cause breakdown anywhere else in the device.

According to various embodiments, device 100 also include N+ junctions 126 and 128, as well as metal contacts 106 and 108, formed on the front side of device 100. In some embodiments, the formation of N+ junctions 126 and 128 and metal contacts 106 and 108 on the front side allows for maximizing the available area for SE and BSE collection on the backside, i.e., the illuminated side, because it improves collection efficiency.

In some embodiments, N+ junctions 126 and 128 are separated by insulator 102, which is a dead area in between segments. In some embodiments, insulator 104 separates N+ junction 128 and through-hole 130. In some embodiments, insulator 104 represents the through-hole dead zone. In some embodiments, the dead zones should be minimized for efficiency. In some embodiments, insulators 102 and 104 are field oxides.

In some embodiments, since primary beam 108 travels through through-hole 130, the sidewalls 124 of through-hole 130 need to be coated and grounded in order to prevent sidewalls 124 from having an impact on primary electron beam 108. In some embodiments, sidewall 124 includes a metal inserted into the sidewall. In some embodiments, the metal in the sidewall is a metal that does not oxidize, such as platinum. This is so that the metal does not form an insulating surface layer that can then charge up and affect primary beam 108 as it passes through through-hole 108.

In some embodiments, N+ junctions 126 and 128 are separated by insulator 102 in order to segment the active area of device 100. As mentioned above, the active area is segmented in order to differentiate between SE and BSE signals. In some embodiments, the segmentation is formed on the front side in order to maximize backside illumination. This is because the field isolation insulators 102 and 104 are not exposed to the reflected SE and BSE, as opposed to front side illuminated devices, and therefore do not charge up and cause damage to the device or affect the electron beam significantly. More details regarding segmented detectors are described below.

Figure 2:
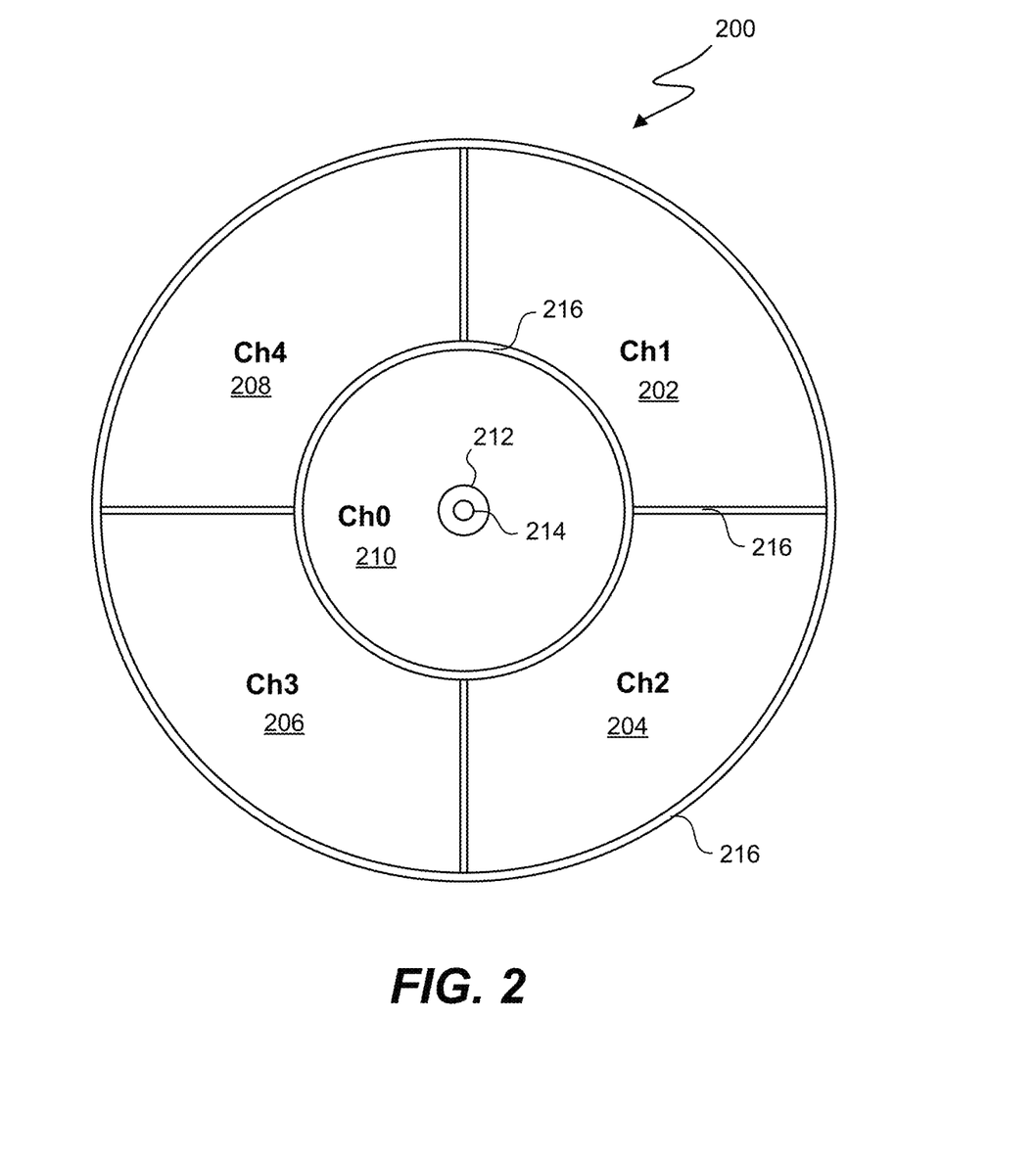
FIG. 2 illustrates an example device active area layout, in accordance with embodiments of the present disclosure.

FIG. 2 illustrates an example device active area layout, in accordance with embodiments of the present disclosure. More specifically, FIG. 2 displays a top down view of the front side of device 100. In some embodiments, active area 200 includes multiple channels segmented by field isolation insulators 216. In some embodiments, insulators 216 represent dead zones in the device. In some embodiments, in the center of active area 200 is through-hole 214 for a primary beam to pass through. In some embodiments, through-hole 214 is through-hole dead zone 212, which may or may not have a shield surrounding the sidewall of through-hole 214. In some embodiments, through-hole 214 and through-hole dead zone 212 is located in the center of center channel 210, labeled Channel 0. In some embodiments, surrounding center channel 210 are outer channels 202, 204, 206, and 208, labeled Channels 1, 2, 3, and 4, respectively. As previously mentioned, in some embodiments, each channel is separated by a dead zone insulator for field isolation.

Figure 3A:
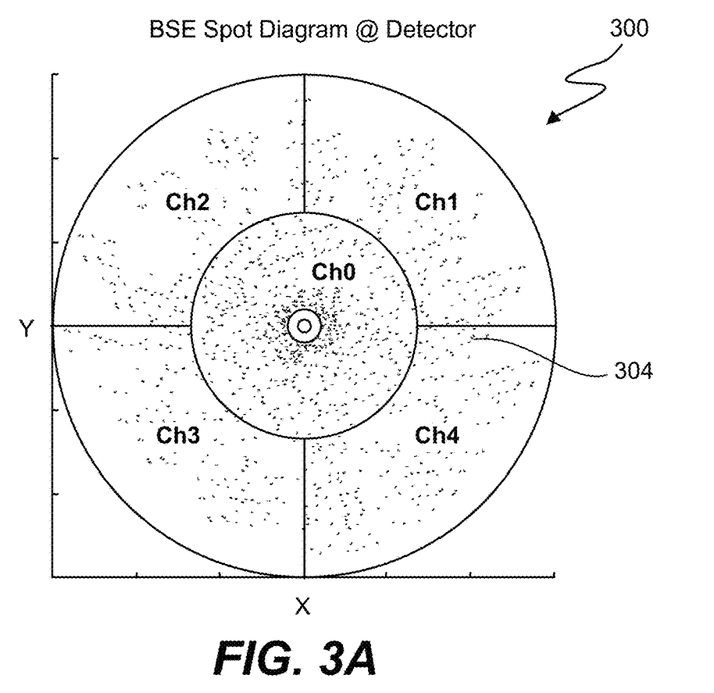
FIG. 3A illustrates an example spot diagram of BSE collection using a segmented detector, in accordance with embodiments of the present disclosure.
Figure 3B:
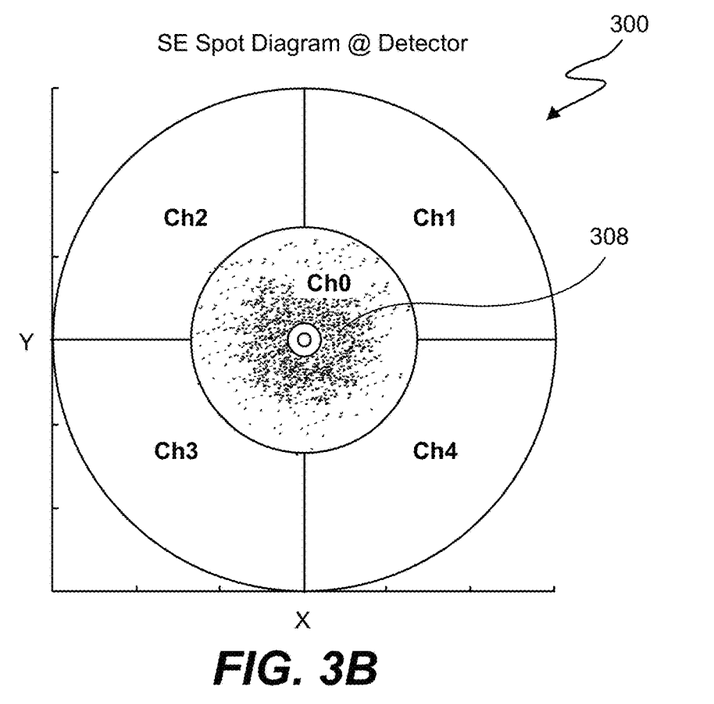
FIG. 3B illustrates an example spot diagram of SE collection using a segmented detector, in accordance with embodiments of the present disclosure.

As described above, segmentation for active area 200 occurs on the front-side of the device (side facing towards primary beam). This improves the SE and BSE collection efficiency on the backside (illuminated area facing towards sample and incoming SE or BSE). FIGS. 3A-3B illustrate how the segmented detector differentiates between SE and BSE signals.

FIG. 3A illustrates an example spot diagram 300 of BSE collection using a segmented detector, in accordance with embodiments of the present disclosure. As shown in FIG. 3A, BSE signals 304 spread out evenly over sot diagram 300. Therefore, BSE signals are spread out pretty evenly across all five channels.

FIG. 3B illustrates an example spot diagram of SE collection using a segmented detector, in accordance with embodiments of the present disclosure. As shown in FIG. 3B, SE collection 308 occurs primarily on the central channel of spot diagram 300, which is Channel 0. This difference is significant because it allows an operator of the electron beam column system to choose which segment (or channel) is best for optimal imaging of a sample or wafer.

In some embodiments, the details of segmentation and multi-channels are exclusive of each other—meaning one can have multiple segments combined to form an independent detection channel. For example, channels can be combined and mixed in appropriate ratios for optimal imaging quality. In addition, channels can be raw signals for SE, e.g., Ch0 (physical inspection), or BSE, e.g., Ch1, 2, 3, and 4. In some embodiments, channels can be mixed for topographic imaging, e.g., (Ch1+Ch2)=(Ch3 +Ch4). In some embodiments, each channel segment can be further segmented to achieve angular information.

Figure 4A:
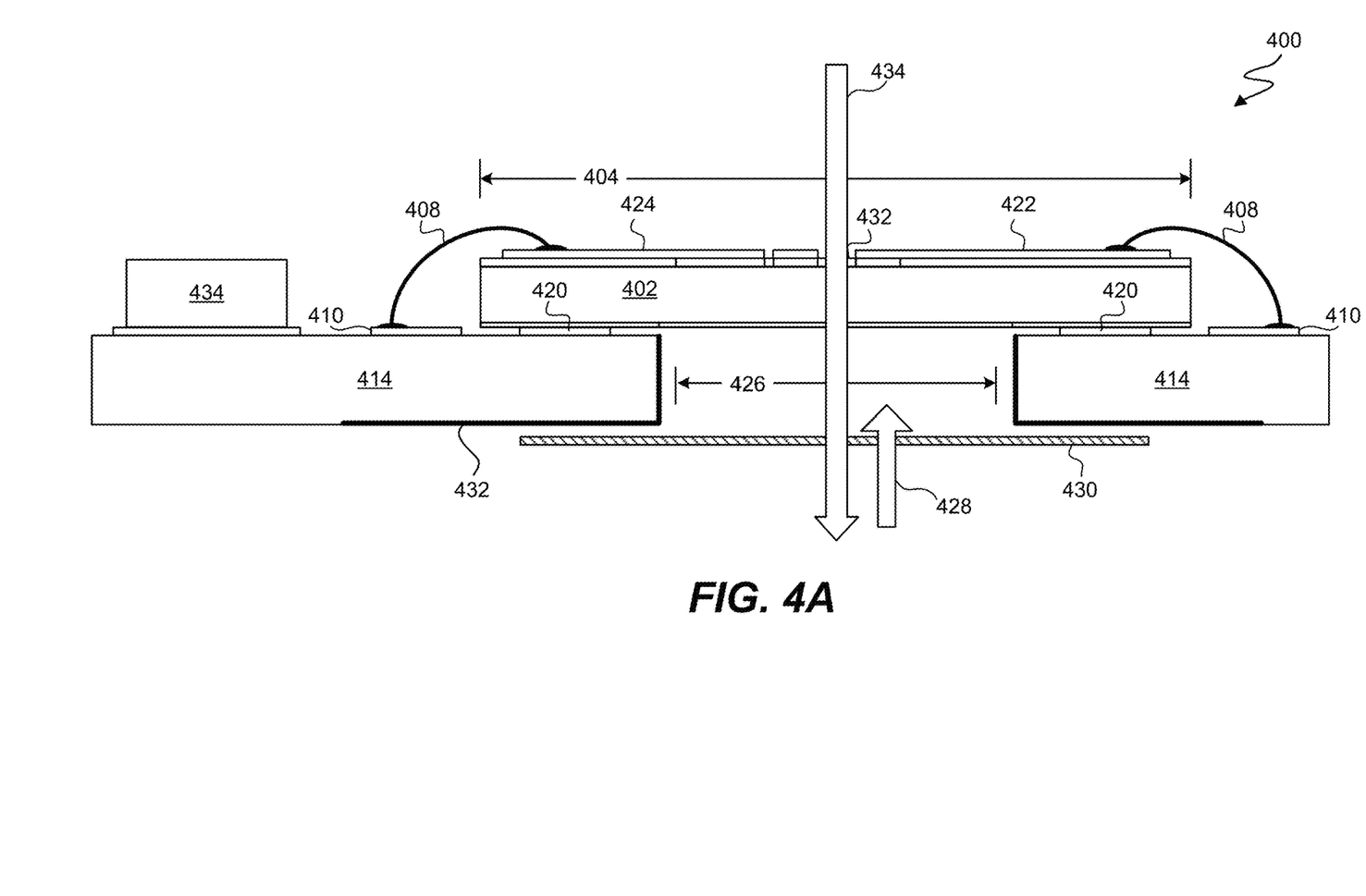
FIGS. 4A-4C illustrate examples of device assemblies, in accordance with embodiments of the present disclosure.
Figure 4B:
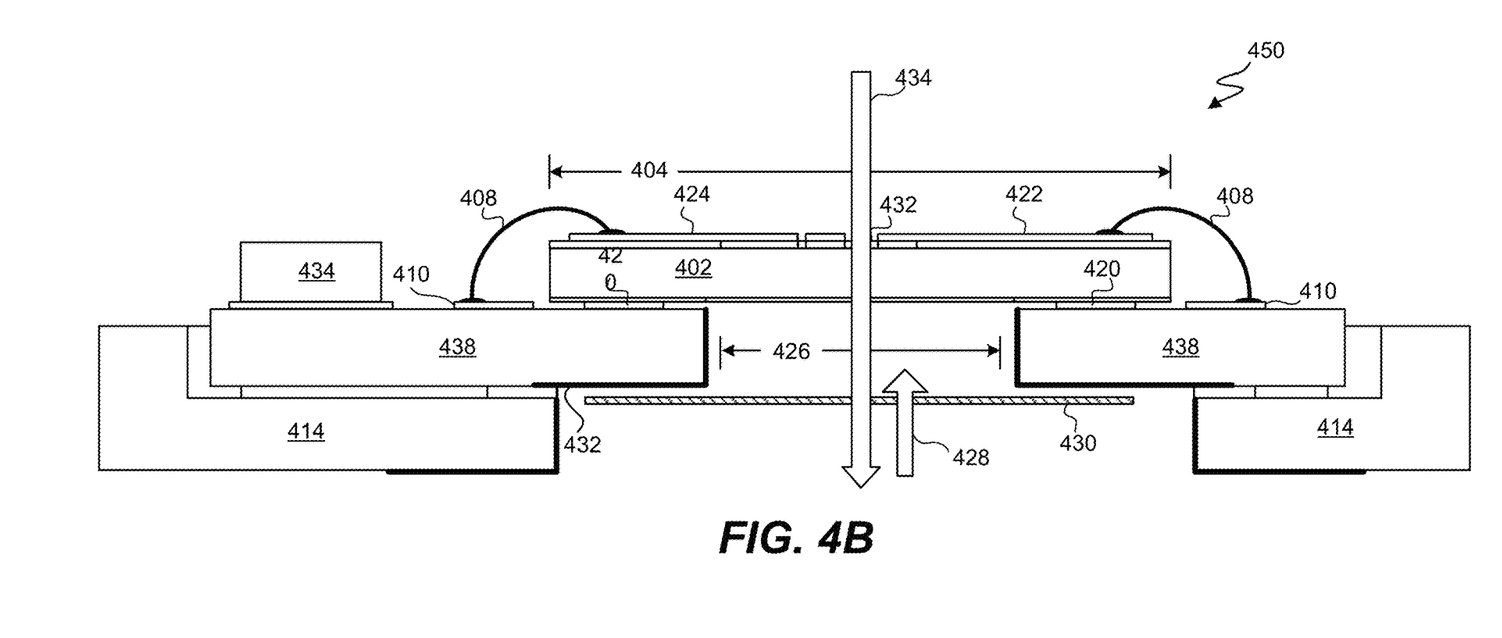
Figure 4C:
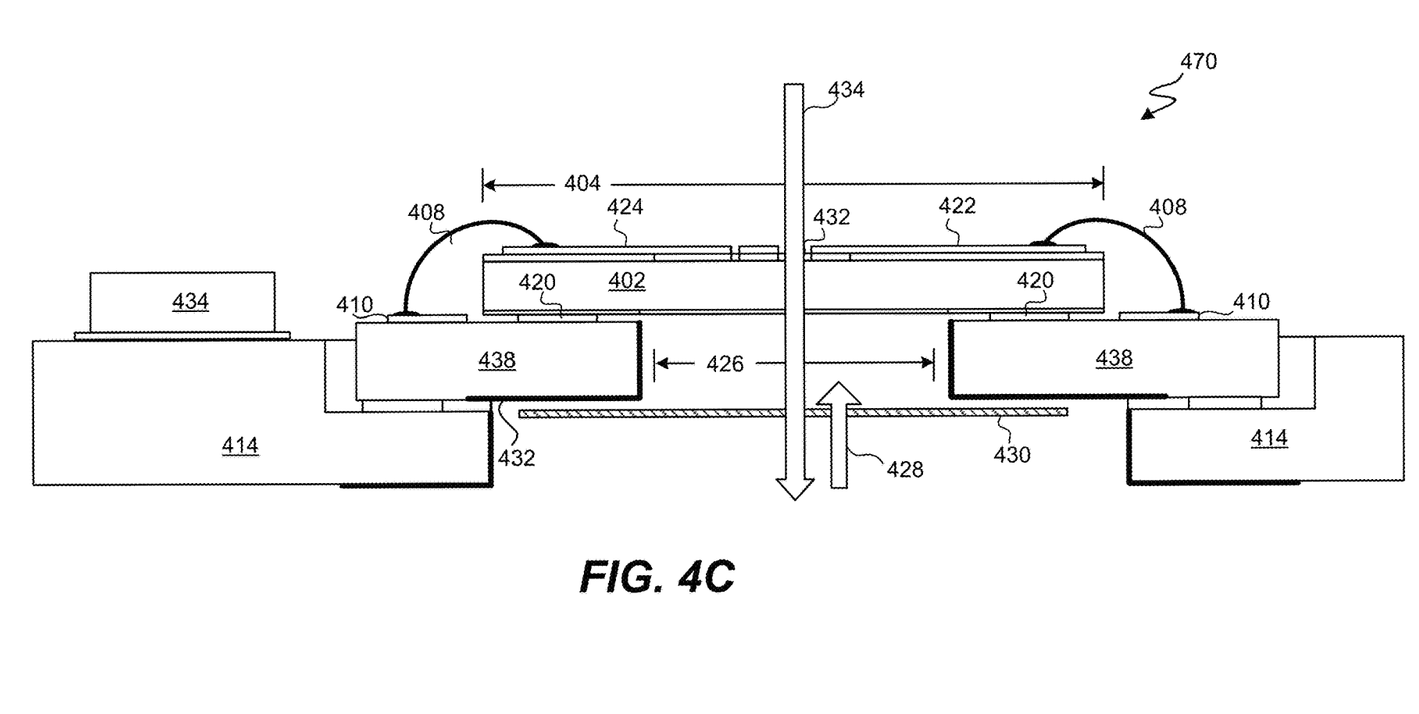

FIGS. 4A-4C illustrate examples of device assemblies 400, 450, and 470, in accordance with embodiments of the present disclosure. FIG. 4A includes device assembly 400 shows a backside illuminated detector 402 attached to substrate 414. In some embodiments, substrate 414 is a ceramic substrate. Some examples of ceramic substrates include aluminum oxide (Al2O3), aluminum nitride (AlN), and quartz. Ceramic substrates are generally used for thick-film applications where the conductors are silk-screened or deposited and patterned by other means. According to various embodiments, different substrate materials are used depending on the mechanical, thermal, or electrical properties needs for the application. In some embodiments, low temperature co-fired ceramic (LTCC), which is generally made of ceramic particles (aluminum nitride, alumina, or silicon nitride powder) mixed with a polymer binder for a lower sintering temperature, e.g., less than 1000 C, allows for a multilayer approach in integrating passive components, e.g., resistors, capacitors, inductors, and conductive traces. In some embodiments, high temperature co-fired ceramic (HTCC), can be used in a similar manner to LTCC, except the sintering temperature is higher, e.g., about 1600 C. The examples above are given as examples only and do not constitute an exhaustive list of ceramic substrates. As shown in FIG. 4A, there is no segmentation on the backside (bottom) of detector 402. In addition, cathode contacts 422 and 424 are on the front side as well, while the anode contacts 420, which are metal, are located on the backside. In some embodiments, wire bonds 408 are coupled to each of the contacts on the front side of detector 402.

In some embodiments, device 402 may be a bare die that is mounted on a ceramic substrate 414, with a substrate hole 426, and readout electronics 434 adjacent to detector 402, and connected via metal layer 410, for low noise. This helps to minimize parasitic capacitance and electronic crosstalk (EMI). In some embodiments, the capacitance and the resistance (series and parallel) of device 402 can be engineered to match the bandwidth and input capacitance requirements of the pre-amplifier electronics. In some embodiments, ceramic substrate 414 includes a metal layer 432 that covers exposed areas of the dielectric to mitigate electron charging.

As shown in FIG. 4B, in some embodiments, assembly 450 includes detector 402, which may be mounted on a sub-carrier (ceramic, LTCC or similar) substrate 438 prior to mounting on substrate 414 to facilitate easier assembly. In some embodiments, this includes wire-bond, ball solder bond, or underfill of contacts prior to mounting on final substrate 414. In some embodiments, carrier 438 (ceramic, LTCC or similar) can also have metallization 432 in select areas, e.g., bore, underside to mitigate electron beam charging of the dielectric. In some embodiments, sub-carrier substrate 438 may be used to divide up the assembly and integration.

FIG. 4C illustrates an assembly 470 which is similar to assembly 450, except that readout electronics 434 is located on substrate 414 instead of sub-carrier substrate 438. In some embodiments, having readout electronics 434 be on substrate 414 instead of sub-carrier 438 may be due to size constraints for sub-carrier 438.

In some embodiments, device 402 may be assembled onto a ceramic substrate with a recess to either minimize wire bond 408 loop heights or enable alternative methods of contacting the cathode, e.g., mechanical clips, spring loaded clamps, screw on clamps, or other methods requiring planar or nearly planar surfaces.

In some embodiments, the package may be used to attach other devices, either active or passive, that enhance the detector performance or the performance of the entire machine, e.g., differential pump apertures, additional amplifiers, electrodes for electron energy filtering, or noise suppression devices.

In some embodiments, multilayer packaging, e.g., LTCC or AlN, enable routing embedded interconnections and devices like heaters, resistors and capacitors that can enhance the detector capabilities, simplify detector design, or improve device performance, such as controlled impedance, e.g. 50 ohm, or matched path length.

According to various embodiments, to facilitate precision alignment, through-hole 432, or a patterned fiducial on the device, may be used for optical registration. In some embodiments, through-hole 432 is placed at or proximate the center of device 402 to allow primary beam 434 to pass through and reflect back SE and BSE 428. In some embodiments, though-hole 432 may be placed off center. In some embodiments, may by multiple through-holes 432, for example, for multi-beam applications.

In some embodiments, through-hole 432 may have any one of various shapes or etch profiles, e.g., straight, tapered, or step. In some embodiments, through-hole 432 may have a conductive coating on the sidewall e.g. metal or impurity doping to mitigate charging. In some embodiments, through-hole 432 may have a shield inserted instead of a protective coating.

Figure 5A:
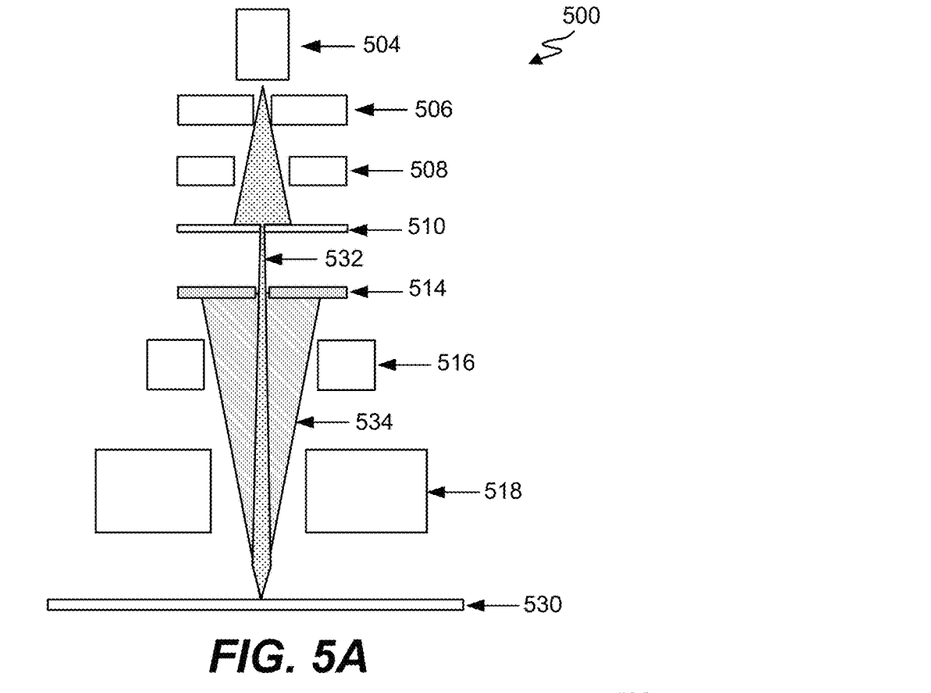
FIGS. 5A-5C illustrate example detection systems, in accordance with embodiments of the present disclosure.
Figure 5B:
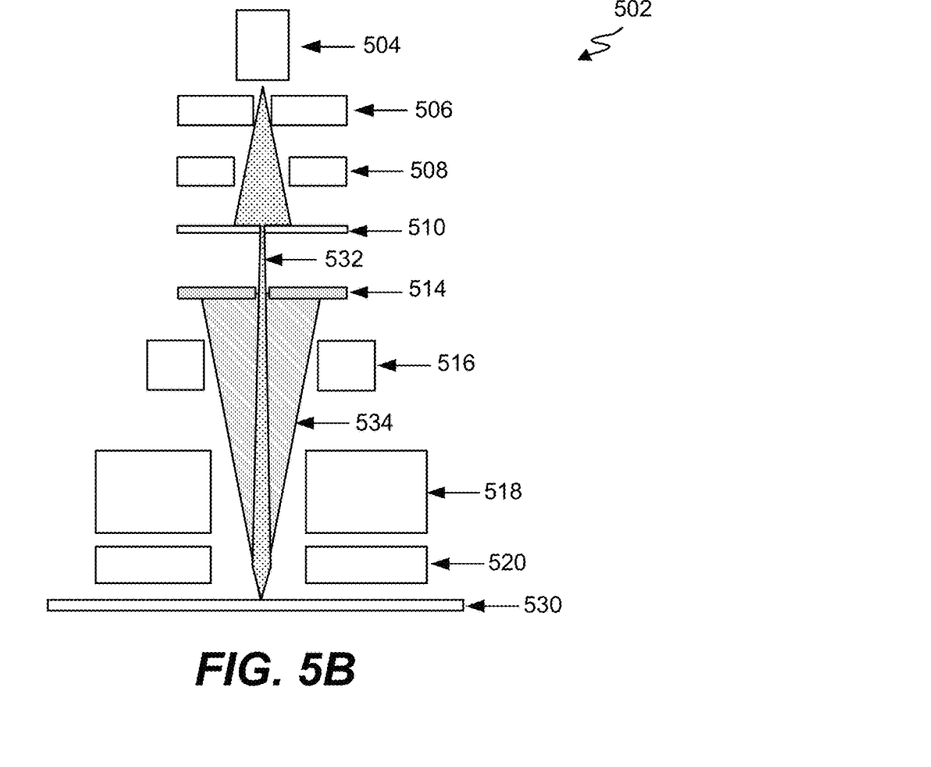

FIG. 5A illustrates an example detection system 500 with a miniature electron beam column, in accordance with embodiments of the present disclosure. FIG. 5B illustrates an example detection system 502 with an alternative miniature electron beamcolumn, in accordance with embodiments of the present disclosure.

In some embodiments, detector 514 is placed in the path of primary beam 532 on-axis in an electron beam column. In some embodiments, primary beam 532 is emitted from electron source 504. In some embodiments, source 504 is an electron emitter. In some embodiments, anode 506 has a high voltage applied to it, thereby creating an electric field, in order to extract electrons from source 504. In some embodiments, beneath anode 506 is an electrostatic condenser lens 508 that focuses beam 532 into limiting aperture 510. In some embodiments, limiting aperture 510 defines the accepted angle at the source. In some embodiments, limiting aperture 510 filters beam 532 down to the order of tens of microns.

In some embodiments, primary beam 532 then passes through the through-hole of detector 514. In some embodiments, primary beam 532 then passes through scan coils or deflectors 516 on its way to sample 530, e.g., a wafer. In such embodiments, these scan coils or deflectors 516 raster scan primary beam 532 over sample 532. In some embodiments, objective lens 518 then focuses primary beam 532 onto sample 530. In some embodiments, after primary beam 532 is raster scanned over sample 530, the electrons are reflected back as secondary/backscattered electrons 534, which return along the primary beam path towards detector 514 in a diffuse manner.

In some embodiments, SE and BSE 534 impact detector 514 at different locations and depending on where primary beam 532 raster scanned the sample, a signal of varying intensity is captured. In some embodiments, depending on the working distance of sample 530 from detector 514, and other operating conditions such as landing energy or focus, one can adjust the composition of SE and BSE signals on detector 514. In some embodiments, read out of the detector signal is done via an amplifier circuit directly adjacent to the detector to minimize noise.

As shown in FIG. 5B, in some embodiments, detection system 502 includes a post-lens element 520 in order to control the SE and BSE signal on detector 514. In some embodiments, by adjusting the distance of the sample (the "working distance") to the bottom of detection system and the voltages on post-lens element 520, the system can control the ratio of SE and BSE signals and focus on the detector and collection efficiency. This allows an operator to obtain images that are primarily SE, primarily BSE, or a combination of both, for optimizing the image quality specific to a sample being imaged. In some embodiments, the working distance is defined as the distance from sample 530 to objective lens 518. In other embodiments, the working distance is defined as the distance from sample 530 to post-lens element 520. In some embodiments, the SE and BSE signals can still be adjusted by changing the working distance only. However, in some embodiments, post-lens element 520, in conjunction with changing working distance, facilitates SE and BSE ratio manipulation.

Figure 5C:
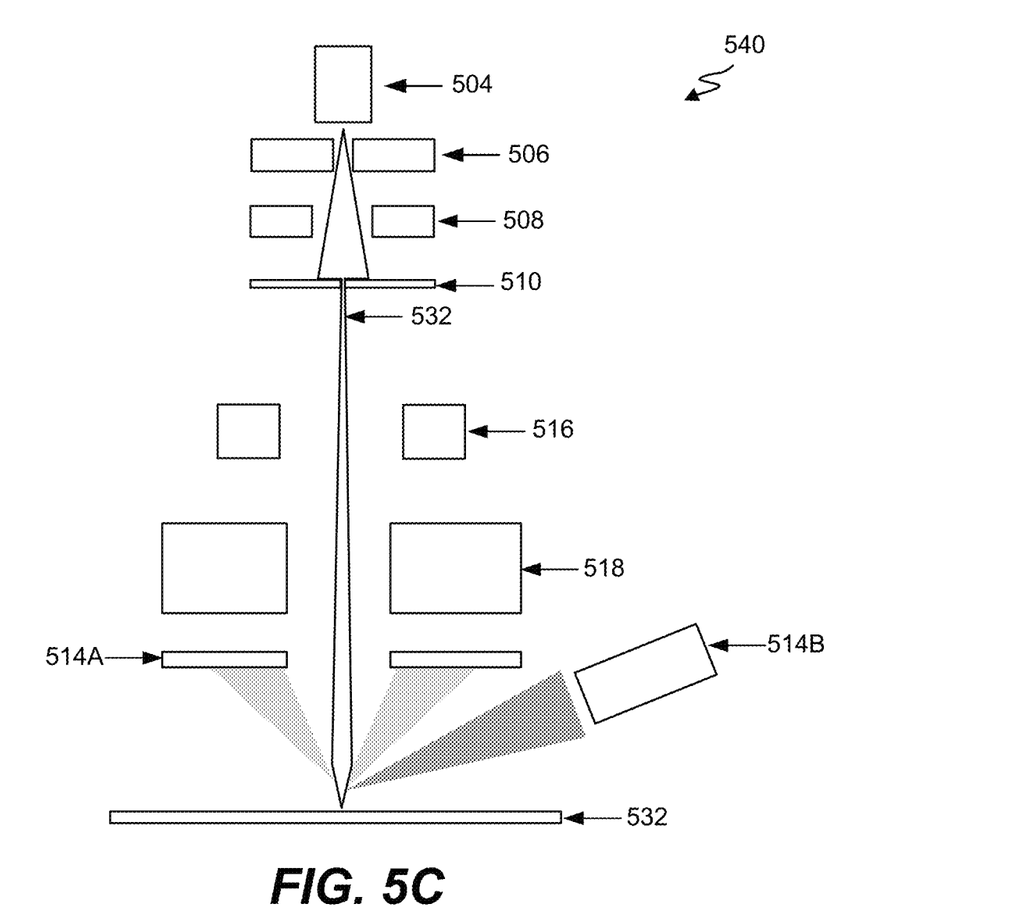

FIG. 5C illustrates detection system 540, which is yet another example of an electron beam column. In some embodiments, detection system 540 has all the same elements as system 500, except that the detector is split into two separate detectors 514A and 514B. In addition, detectors 514A and 514B are located after objective lens 518. In some embodiments, detector 514A detects BSE and detector 514B detects SE. In some embodiments, detector 514B uses a strong electric field to pull the low energy SE off to the side. In some embodiments, having detectors located after the objective lens has several disadvantages, which include a shorter working distance, as well as a higher detector susceptibility to contamination (e.g., degas, sublimation, evaporation).

Figure 6A:
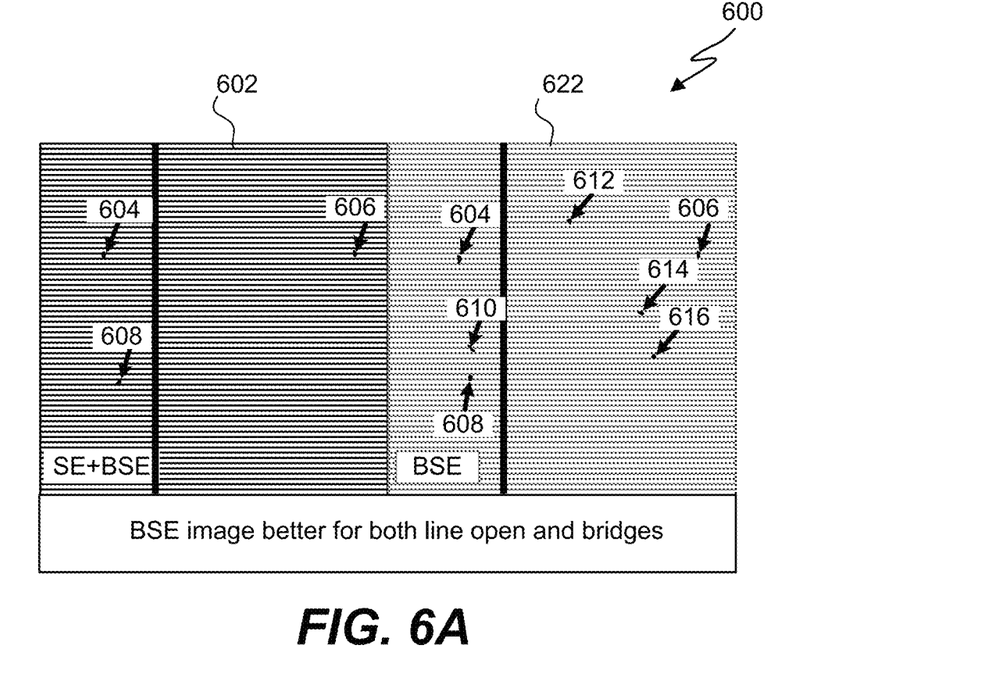
FIGS. 6A-6D illustrate examples of defect captures using signal/mix differentiation, in accordance with embodiments of the present disclosure.

FIGS. 6A and 6B illustrate examples of defect captures using signal mix/differentiation, in accordance with embodiments of the present disclosure. FIG. 6A displays a defect capture 602 of a mix of SE+BSE signals juxtaposed with a defect capture 622 of just the BSE signals. As can be seen in FIG. 6A, SE+BSE defect capture 602 displays defects 604, 606, and 608. However, BSE only defect capture 622 shows the same three defects plus additional defects 610, 612, 614, and 616. Thus, in the particular example in FIG. 6A, the BSE only image is better for discovering defects. In some embodiments, BSE only images are better for both line open (FIG. 6C, line open at 654) and line bridges (FIG. 6D, line bridge at 658).

Figure 6B:
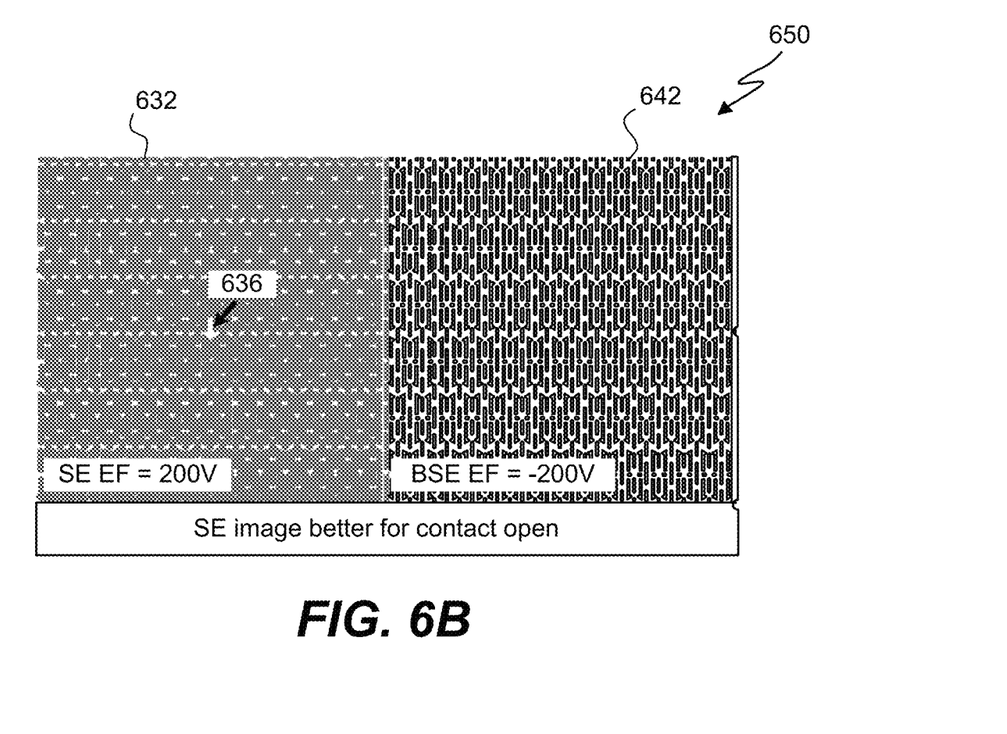
Figure 6C:
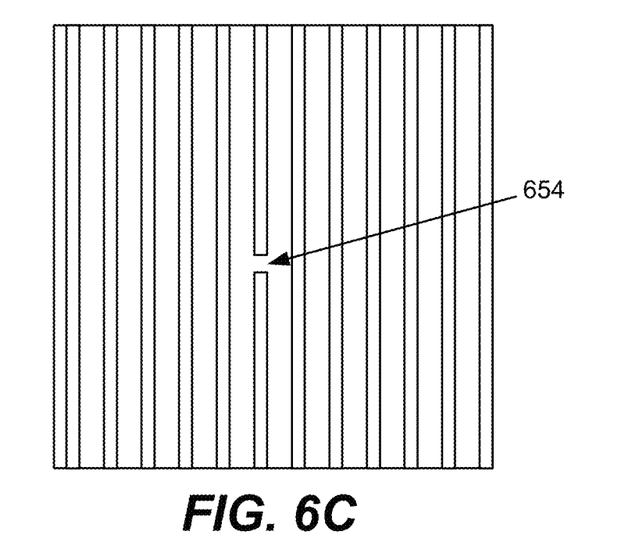
Figure 6D:
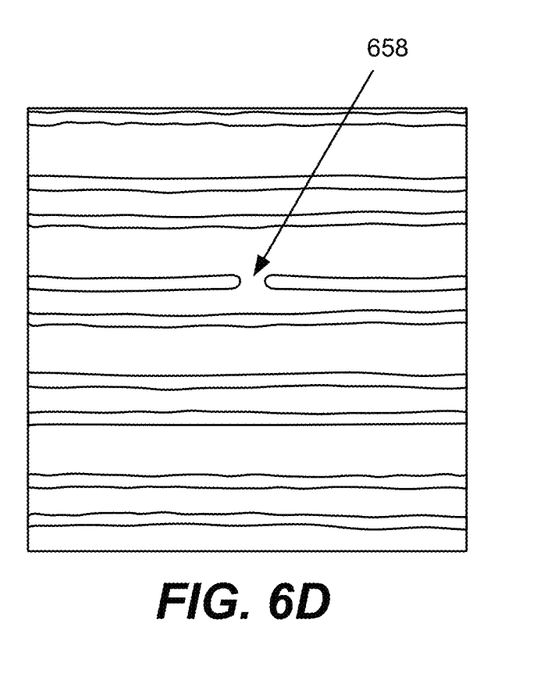

FIG. 6B displays a defect capture 632 of SE only signals juxtaposed with a defect capture 642 of just the BSE signals. As can be seen in FIG. 6B, SE only defect capture 632 displays a defect 636. However, BSE only defect capture 642 does not show any defects. Thus, in the particular example in FIG. 6B, the SE only image is better for discovering defects. In some embodiments, SE only images are better for contact open.

Figure 7:
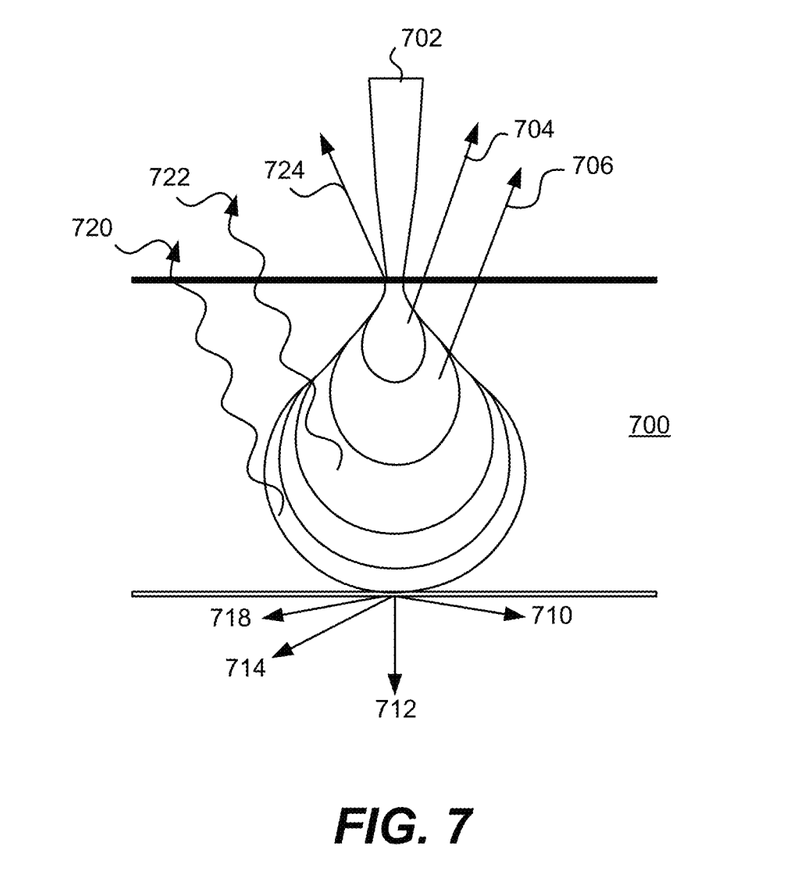
FIG. 7 is a diagram illustrating how different types of electrons are reflected off a sample, in accordance with embodiments of the present disclosure.

FIG. 7 is a diagram illustrating how different types of electrons are reflected off a sample. FIG. 7 shows primary electron beam 702 hitting sample 700. After hitting the sample, several different types of illumination that reflect back and provide different information. Auger electrons 724, for example, provide surface atomic composition information. Characteristic X-ray 722 gives thickness atomic composition, while Cathodoluminescence 720 gives electronic states information. Some electrons that penetrate through to the other side of the sample are either transmitted 712 or scattered in multiple directions 714 (incoherent elastic scattering), 718 (inelastic scattering), and 710 (elastic scattering).

For the purposes of this disclosure, the systems described above focus on secondary electrons (SE) and backscattered electrons (BSE). BSEs are reflected after elastic collisions between electron beam and sample. SEs originate from the atoms of the sample. They are the result of inelastic collisions between the beam and sample. BSEs come from deeper regions of the sample, while SEs originate from the surface region.

BSE and SE images carry different types of information. BSE images show high sensitivity to differences in atomic number of the material being imaged; the higher the atomic number, the brighter the material appears in the image. SE images provide more detailed surface information e.g. topology. The effectiveness of BSE vs SE for imaging defects e.g. line open, bridges, pin-hole, pin-dots etc can be dependent on landing energy, material, incident angle, and pattern/topology of sample.

In some embodiments, solid state detectors can be made from many different materials and formats. The following examples could all replace the silicon PIN detectors. Segmented micro-channel plate can give higher gain signal, as well as pick up lower energy electrons. Photomultiplier/scintillator with segmented photo detector can give higher gain. Silicon Drift Detector (SDD) gives energy discrimination. Charge Coupled Device (CCD) can give better spatial resolution. Other solid-state material types —e.g. GaN, diamond, etc.—can operate at higher temperatures, meaning they are more rugged than silicon.

Certain embodiments of the present disclosure presented here generally address the field of semiconductor inspection and process control, and are not limited to the hardware, algorithm/software implementations and architectures, and use cases summarized above.

Although the foregoing disclosure has been described in some detail for purposes of clarity of understanding, it will be apparent that certain changes and modifications may be practiced within the scope of the appended claims. It should be noted that there are many alternative ways of implementing the processes, systems, and apparatus of the present disclosure. Accordingly, the present embodiments are to be considered as illustrative and not restrictive, and the disclosure is not to be limited to the details given herein.

What is claimed is:

1. A solid state device, the device comprising:
    a vertical structure comprising an N+/P−/P+ or a P+/N−/N+ structure for full depletion through the thickness of the device, the N+/P−/P+ or a P+/N−/N+structure including an N+ or P+ junction formed on the front side of the device, a P− or N− intrinsic layer in the middle, and a P+ or N+ layer formed on the backside of the device;
    an active area for collecting secondary electrons (SEs) and backscatter electrons (BSEs), the active area being segmented into multiple channels in order to separate detection of secondary and backscatter electrons; and
    a through hole placed in the center of the device to allow a primary beam to pass through the device, wherein the primary beam enters the through hole on the front side of the device.

2. The device of claim 1, wherein the segmentation appears on the front side of the device and SEs and BSEs are collected on the back side of the device.

3. The device of claim 1, wherein the front side of the device also includes metal contacts to maximize the available area for SE and BSE collection.

4. The device of claim 1, wherein the P+ layer comprises boron or another acceptor dopant.

5. The device of claim 1, wherein the P+ layer includes an additional conductive coating.

6. The device of claim 1, further comprising a post lens element for controlling the SE and BSE signals on the device.

7. The method of claim 1, wherein the segmented channels comprise a circular center channel surrounded by four quadrants of equal area, wherein each of the four quadrants has the same area as the circular center channel.

8. A system comprising
    an electron source;
    a ceramic substrate; and
    a device coupled to the ceramic substrate, the device comprising:
        a vertical structure comprising an N+/P−/P+ or a P+/N−/N+ structure for full depletion through the thickness of the device, the N+/P−/P+ or a P+/N−/N+ structure including an N+ or P+ junction formed on the front side of the device, a P− or N− intrinsic layer in the middle, and a P+ or N+ layer formed on the backside of the device;
        an active area for collecting secondary electrons (SEs) and backscatter electrons (BSEs), the active area being segmented into multiple channels in order to separate detection of secondary and backscatter electrons; and
        a through hole placed in the center of the device to allow a primary beam to pass through the device, wherein the primary beam enters the through hole on the front side of the device.

9. The system of claim 8, wherein the segmentation appears on the front side of the device and SEs and BSEs are collected on the back side of the device.

10. The system of claim 8, wherein the front side of the device also includes metal contacts to maximize the available area for SE and BSE collection.

11. The system of claim 8, wherein the P+ layer comprises boron or another acceptor dopant.

12. The system of claim 8, wherein the P+ layer includes an additional conductive coating.

13. The system of claim 8, wherein the device further comprises a post lens element for controlling the SE and BSE signals on the device.

14. The system of claim 8, wherein the segmented channels comprise a circular center channel surrounded by four quadrants of equal area, wherein each of the four quadrants has the same area as the circular center channel.

15. A electron detection system comprising:
    an electron beam column including a detector for collecting secondary and backscatter electrons, the detector comprising:
        a vertical structure comprising an N+/P−/P+ or a P+/N−/N+ structure for full depletion through the thickness of the device, the N+/P−/P+ or a P+/N−/N+ structure including an N+ or P+ junction formed on the front side of the device, a P− or N− intrinsic layer in the middle, and a P+ or N+ layer formed on the backside of the device;
        an active area for collecting secondary electrons (SEs) and backscatter electrons (BSEs), the active area being segmented into multiple channels in order to separate detection of secondary and backscatter electrons; and
        a through hole placed in the center of the device to allow a primary beam to pass through the device, wherein the primary beam enters the through hole on the front side of the device.

16. The electron detection system of claim 15, wherein the segmentation appears on the front side of the device and SEs and BSEs are collected on the back side of the device.

17. The electron detection system of claim 15, wherein the front side of the device also includes metal contacts to maximize the available area for SE and BSE collection.

18. The electron detection system of claim 15, wherein the P+ layer comprises boron or another acceptor dopant.

19. The electron detection system of claim 15, wherein the P+ layer includes an additional conductive coating.

20. The electron detection system of claim 15, wherein the device further comprises a post lens element for controlling the SE and BSE signals on the device.

* * * * *

UNITED STATES PATENT AND TRADEMARK OFFICE
CERTIFICATE OF CORRECTION

PATENT NO. : 11,699,607 B2
APPLICATION NO. : 17/483545
DATED : July 11, 2023
INVENTOR(S) : John Gerling et al.

Page 1 of 2

It is certified that error appears in the above-identified patent and that said Letters Patent is hereby corrected as shown below:

In the Drawings

In FIGS. 4A, 4B, and 4C, the reference numeral 434 for the primary beam should be 435 and the reference numeral 432 for the through-hole should be 433. In addition, in FIG. 5C, the reference number 532 for the sample should be 530.

In the Specification

Column 7, Line 13, please change "sot" to --spot--.
Column 8, Line 47, please change "through-hole 432" to --through-hole 433--.
Column 8, Line 49, please change "through-hole 432" to --through-hole 433--.
Column 8, Line 50, please change "primary beam 434" to --primary beam 435--.
Column 8, Line 52, please change "through-hole 432" to --through-hole 433--.
Column 8, Line 53, please change "through-holes 432" to --through-holes 433--.
Column 8, Line 55, please change "through-hole 432" to --through-hole 433--.
Column 8, Line 57, please change "through-hole 432" to --through-hole 433--.
Column 8, Line 60, please change "through-hole 432" to --through-hole 433--.
Column 9, Line 18, please change "sample 532" to --sample 530--.
Column 10, Line 4, please change "defect captures" to --defect captures 600 and 650--.

In the Claims

In Claim 2, Column 11, Line 30, please change "The device of claim 1" to --The solid state device of claim 1--.
In Claim 3, Column 11, Line 33, please change "The device of claim 1" to --The solid state device of claim 1--.
In Claim 4, Column 11, Line 36, please change "The device of claim 1" to --The solid state device of claim 1--.
In Claim 5, Column 11, Line 38, please change "The device of claim 1" to --The solid state device of claim 1--.

Signed and Sealed this
Twenty-seventh Day of August, 2024

Katherine Kelly Vidal
*Director of the United States Patent and Trademark Office*

CERTIFICATE OF CORRECTION (continued)
U.S. Pat. No. 11,699,607 B2

In Claim 6, Column 11, Line 40, please change "The device of claim 1" to --The solid state device of claim 1--.
In Claim 7, Column 11, Line 43, please change "The method of claim 1" to --The solid state device of claim 1--.